MEANS FOR MAKING AN ELECTRICAL CONNECTION
TO A FLEXIBLE PRINTED CIRCUIT
Filed Nov. 27, 1967

INVENTOR
K. Werda
BY [signature]
ATTORNEYS

United States Patent Office 3,476,901

Patented Nov. 4, 1969

3,476,901

MEANS FOR MAKING AN ELECTRICAL CONNECTION TO A FLEXIBLE PRINTED CIRCUIT

Konrad Werda, Clitheroe, England, assignor to Joseph Lucas (Industries) Limited, Birmingham, England, a British company Filed Nov. 27, 1967, Ser. No. 685,801
Claims priority, application Great Britain, Dec. 9, 1966, 55,173/66
Int. Cl. H01h *9/02*
U.S. Cl. 200—166 3 Claims

ABSTRACT OF THE DISCLOSURE

Means for making an electrical connection to a flexible printed circuit includes a base over which the flexible printed circuit extends and an electrical contact fixed with respect to the base. Resilient means are provided acting between the base and the flexible printed circuit to urge an exposed conductive area of the printed circuit into engagement with the contact.

This invention relates to means for making an electrical connection to a flexible printed circuit.

Means according to the invention includes a base over which the flexible printed circuit extends, an electrical contact fixed with respect to the base, and resilient means acting between the base and the flexible printed circuit to urge an exposed conductive area of the printed circuit into engagement with the contact.

Figure 1:
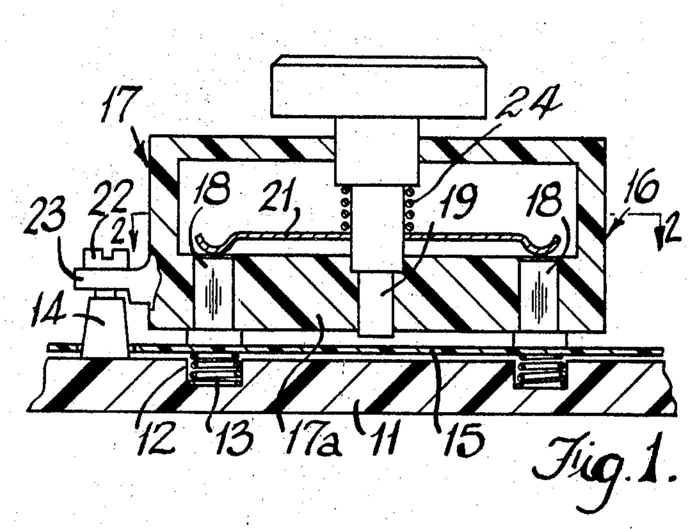
Figure 2:
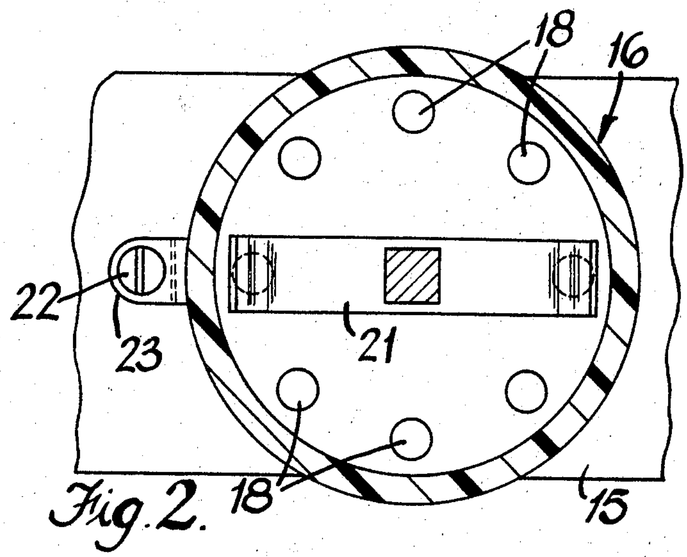

An example of the invention is illustrated in the accompanying drawings wherein FIGURE 1 is a sectional view of a switch and its associated parts, and FIGURE 2 is a sectional view on the line 2—2 in FIGURE 1.

Referring to the drawing, there is provided a base 11 having formed therein a plurality of bores 12 each of which has engaged therein a truncated conical spring 13, the wider lower convolutions of each spring 13 being an interference fit in the respective bore 12, while the narrower convolutions thereof project from the respective bore 12. The base 11 is further formed with an upstanding post 14.

A flexible printed circuit 15 having exposed conductive areas on its upper surface is laid on the base 11 and the arrangement is such that each of the conductive areas extends over one of the springs 13. The circuit 15 is formed with a hole to accommodate the post 14.

There is further provided a switch 16 comprising a hollow body part 17 the base **17*a* of which carries fixed contacts 18, the contacts 18 extending through the base 17*a*. Rotatably mounted in the body part 17 is a rotor shaft 19 which carries a bridging contact 21 engageable with the inner ends of the contacts 18. The switch 16 is secured to the base 11 by a screw 22 which extends through a lug 23 on the body part 17, into the post 14. When the switch 16 is firmly secured to the base 11, the outer ends of the contacts 18 engage the conductive areas of the printed circuit 15 and the springs 13 are compressed into their respective bores 12. Since the springs 13 are compressed, they urge the conductive areas of the circuit 15 firmly into engagement with the contacts 18 thereby ensuring a good electrical connection The contact 21 is urged by a spring 24, towards the base 17*a* and as the shaft 19 rotates the contact 21 rides over the inner ends of the contacts 18 thereby completing electrical circuits between the respective conductive areas of the circuit 15**.

In the preferred embodiment the contacts 18 present a flat surface to the conductive areas of the circuit 15 but the contact faces could be convex or concave. Moreover it will be apreciated that the contact 21 can be shaped so as to bridge more than two of the contacts 18 if required.

Having thus described my invention what I claim as new and desire to secure by Letters Patent is:

1. Means for making an electrical connection to a flexible printed circuit, comprising an electrically insulating base having therein a plurality of bores, a plurality of springs within said bores respectively, an insulating body extending parallel to said base, a plurality of fixed contacts carried by said insulating body, means locating said insulating body relative to said base, and a flexible printed circuit extending over said base, said springs urging exposed conductive areas of said flexible printed circuit into engagement with said contacts.

2. Means as claimed in claim 1 in which said insulating body is part of a housing in which is journalled a rotor carrying a movable contact, said fixed contact extending through said insulating body and being engaged by said movable contact whereby angular movement of said rotor makes and breaks circuits between said fixed contacts.

3. Means as claimed in claim 1 wherein each spring is of frusto-conical configuration, a relatively large diameter convolution at one end of each spring gripping the wall of said bore to maintain the spring engaged with the base.

References Cited

UNITED STATES PATENTS 3,278,714 10/1966 Bernutz.
3,188,435 6/1965 Rugsten.

H. O. JONES, Primary Examiner

U.S. Cl. X.R.

317—101